(12) United States Patent
Lo et al.

(10) Patent No.: US 9,318,666 B2
(45) Date of Patent: Apr. 19, 2016

(54) LIGHT EMITTING DIODE DEVICE AND METHOD FOR MANUFACTURING SAME

(71) Applicant: ADVANCED OPTOELECTRONIC TECHNOLOGY, INC., Hsinchu Hsien (TW)

(72) Inventors: Hsing-Fen Lo, Hsinchu (TW); Lung-Hsin Chen, Hsinchu (TW)

(73) Assignee: ADVANCED OPTOELECTRONICS TECHNOLOGY, INC., Hsinchu Hsien (TW)

( * ) Notice: Subject to any disclaimer, the term of this patent is extended or adjusted under 35 U.S.C. 154(b) by 49 days.

(21) Appl. No.: 14/085,804

(22) Filed: Nov. 21, 2013

(65) Prior Publication Data

US 2014/0291720 A1 Oct. 2, 2014

(30) Foreign Application Priority Data

Mar. 28, 2013 (CN) .......................... 2013 1 0103017

(51) Int. Cl.
*H01L 21/00* (2006.01)
*H01L 27/15* (2006.01)
(Continued)

(52) U.S. Cl.
CPC .............. *H01L 33/486* (2013.01); *H01L 24/97* (2013.01); *H01L 33/54* (2013.01); *H01L 33/62* (2013.01);
(Continued)

(58) Field of Classification Search
CPC ................ H01L 21/4842; H01L 21/78; H01L 2224/16245; H01L 2224/753; H01L 2224/75303; H01L 2224/7555; H01L 2224/80047; H01L 2224/80947; H01L 24/97; H01L 2933/005; H01L 2933/0066; H01L 33/486; H01L 33/54; H01L 33/62; H01L 2224/75; H01L 2224/76; H01L 2224/7625; H01L 2224/763; H01L 2224/76301; H01L 2224/76302; H01L 2224/76303; H01L 2224/76304; H01L 2224/76305; H01L 2224/7655; H01L 2224/7755; H01L 2224/7855; H01L 2224/7955; H01L 2224/80; H01L 2224/80001; H01L 2224/80009; H01L 2224/809; H01L 2224/80901; H01L 2224/80909; H01L 2224/8093; H01L 2224/83; H01L 2224/83009; H01L 2224/8303; H01L 2224/83047; H01L 2224/83909; H01L 2224/8393; H01L 2224/83947; H01L 2224/84; H01L 2224/84009; H01L 2224/8403; H01L 2224/84047; H01L 2224/84909; H01L 2224/8493; H01L 2224/84947
USPC .............. 257/81, 98, 99, 100; 438/26, 28, 33, 438/121, 124, 133, 110, 113; 29/827, 837, 29/838
See application file for complete search history.

(56) References Cited

U.S. PATENT DOCUMENTS

2009/0090928 A1* 4/2009 Mori et al. ...................... 257/99
2010/0133557 A1* 6/2010 Kwon et al. ..................... 257/88

(Continued)

FOREIGN PATENT DOCUMENTS

JP 57204184 A * 12/1982 .............. H01L 33/00

*Primary Examiner* — Teresa M Arroyo
(74) *Attorney, Agent, or Firm* — Novak Druce Connolly Bove + Quigg LLP

(57) ABSTRACT

An LED device includes a substrate having a top surface and a bottom surface. The substrate defines a through hole at a center thereof. The LED device also includes an electrode board. The electrode board defines a concave portion at a center thereof, and a convex portion connected to and surrounding two sides of the concave portion. The concave portion includes a first electrode and a second electrode isolated from each other, and is located in the through hole of the substrate. A bottommost surface of the concave portion is substantially coplanar with the bottom surface of the substrate, and a top surface of the convex portion is substantially coplanar with the top surface of the substrate. An LED chip is arranged on the concave portion, and is electrically connected to the first electrode and the second electrode. A method for manufacturing plural such LED devices is also provided.

7 Claims, 8 Drawing Sheets

(51) Int. Cl.
*H01L 29/267* (2006.01)
*H01L 31/12* (2006.01)
*H01L 33/00* (2010.01)
*H01L 33/48* (2010.01)
*H01L 23/00* (2006.01)
*H01L 33/54* (2010.01)
*H01L 33/62* (2010.01)

(52) U.S. Cl.
CPC .............. *H01L 2224/16245* (2013.01); *H01L 2224/80047* (2013.01); *H01L 2924/12041* (2013.01); *H01L 2924/181* (2013.01); *H01L 2933/005* (2013.01); *H01L 2933/0066* (2013.01)

(56) References Cited

U.S. PATENT DOCUMENTS

| | | | |
|---|---|---|---|
| 2010/0181582 A1* | 7/2010 | Li et al. | 257/91 |
| 2013/0049023 A1* | 2/2013 | Kim | 257/88 |
| 2013/0052764 A1* | 2/2013 | Chen et al. | 438/26 |
| 2013/0288406 A1* | 10/2013 | Chen et al. | 438/27 |
| 2013/0288407 A1* | 10/2013 | Lo | 438/27 |
| 2014/0177242 A1* | 6/2014 | Nam et al. | 362/382 |
| 2014/0226308 A1* | 8/2014 | Fukuda et al. | 362/84 |
| 2014/0306250 A1* | 10/2014 | Gardner et al. | 257/89 |
| 2014/0327024 A1* | 11/2014 | Ishihara et al. | 257/98 |

\* cited by examiner

LIGHT EMITTING DIODE DEVICE AND METHOD FOR MANUFACTURING SAME

BACKGROUND

1. Technical Field

The present disclosure generally relates to solid state light emitting devices and, more particularly, to a light emitting diode (LED) device and a method for manufacturing a plurality of the LED devices.

2. Description of Related Art

LEDs have many advantages, such as high luminosity, low operational voltage, low power consumption, compatibility with integrated circuits, easy driving, long term reliability, and environmental friendliness. These benefits have promoted the wide use of LEDs as a light source.

Generally, an LED device includes a substrate, an LED, a reflective cup, and an electrode layer formed on an upper surface of the substrate. The LED is received in the reflective cup and electrically connected to the electrode layer. A height of the reflective cup is greater than that of the LED; therefore, light emitted from the LED can be reflected outward by the reflective cup for illuminating. However, the LED device is rather thick due to the size of the substrate and the reflective cup.

Therefore, what is needed is an LED device and a method for manufacturing the LED device which can overcome the above-described limitations.

DETAILED DESCRIPTION OF EMBODIMENTS

Figure 1:
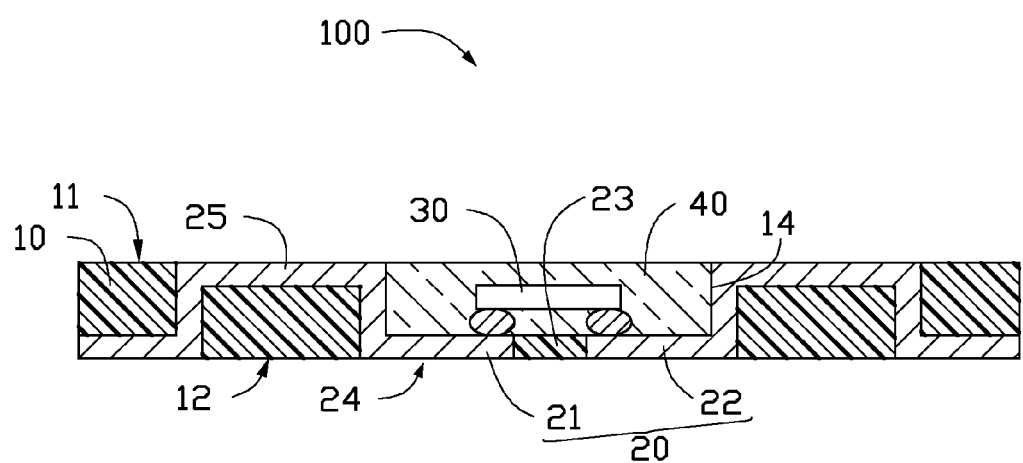
FIG. 1 is a cross-sectional view of an LED device, in accordance with an exemplary embodiment of the present disclosure.

Referring to FIG. 1, an LED device 100 in accordance with an exemplary embodiment is provided. The LED device 100 includes a substrate 10, an electrode board 20, an LED chip 30, and an encapsulant 40 covering the LED chip 30.

The substrate 10 includes a top surface 11 and a bottom surface 12 at opposite sides thereof. The substrate 10 defines a through hole 14 at a center thereof. The electrode board 20 includes a first electrode 21 and a second electrode 22 both at a center thereof. An insulated portion 23 is formed between the first electrode 21 and the second electrode 22. The electrode board 20 has a concave portion 24 at the center thereof, and a convex portion 25 connected to and surrounding two sides of the concave portion 24. The concave portion 24 includes the two electrodes 21, 22, and is located in the through hole 14 of the substrate 10. Thus the concave portion 24 is bifurcated, and the convex portion 25 is correspondingly bifurcated.

A bottommost surface of the concave portion 24 is substantially coplanar with the bottom surface 12 of the substrate 10, and a top surface of the convex portion 25 is substantially coplanar with the top surface 11 of the substrate 10. The LED chip 30 is arranged on the concave portion 24 of the electrode board 20 and electrically connected to the first electrode 21 and the second electrode 22. In the present embodiment, the LED chip 30 is electrically connected to the first electrode 21 and the second electrode 22 via flip-chip bonding. In an alternative embodiment, the electrode board 20 can further have a bifurcated extending portion (not labeled) extending downwardly from outer ends of the convex portion 25, and a bifurcated flat portion (not labeled) extending horizontally and outwardly from the extending portion. The concave portion 24 can reflect light emitted from the LED chip 30. Accordingly, the LED device 100 does not need a reflective cup on the substrate 10, and the thickness and size of the LED device 100 is thereby reduced.

The encapsulant 40 is received in the concave portion 24 of the electrode board 20, and covers the LED chip 30. In the present embodiment, an upper surface of the encapsulant 40 is substantially coplanar with the top surface 11 of the substrate 10; therefore, the LED device 100 is planar and has a smaller height.

Referring to FIGS. 2 to 8, a method for manufacturing a plurality of the LED devices 100 in accordance with an exemplary embodiment is provided. The method includes the following steps.

Figure 2:
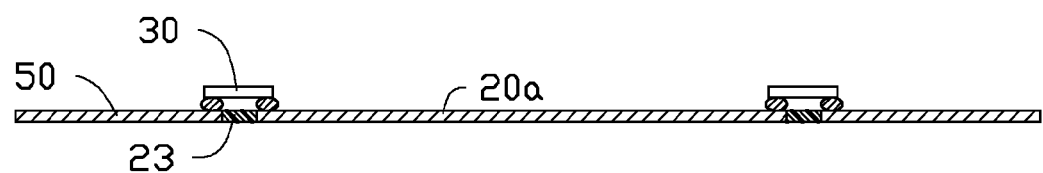
FIGS. 2 to 8 are cross-sectional views showing different successive steps of a method for manufacturing a plurality of the LED devices of FIG. 1, in accordance with an exemplary embodiment of the present disclosure.

Referring to FIG. 2, the first step is to provide a metal board 50. A plurality of insulated portions 23 is formed in the metal board 50 to divide the metal board 50 into a plurality of isolated electrode preforms 20a. Typically, even though not shown, there are numerous insulated portions 23 and numerous isolated electrode preforms 20a. Each two adjacent electrode preforms 20a are electrically connected to one corresponding LED chip 30 therebetween.

Figure 3:
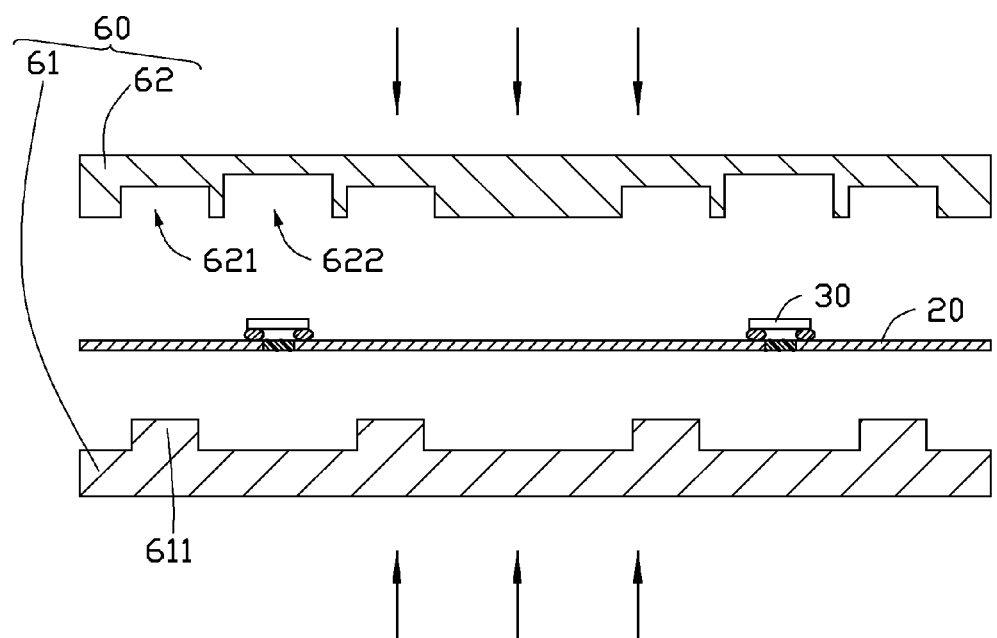
Figure 4:
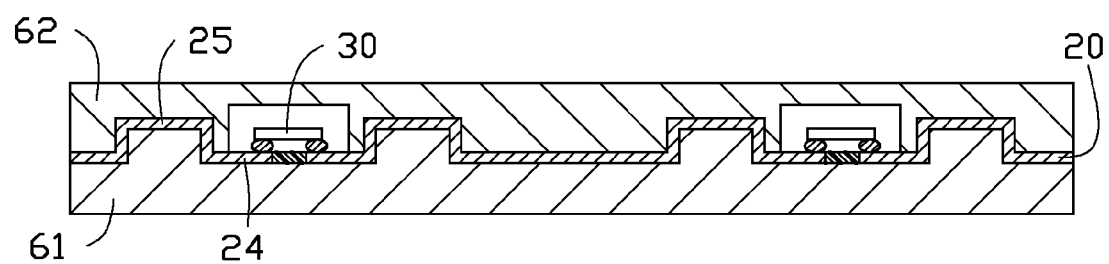
Figure 5:
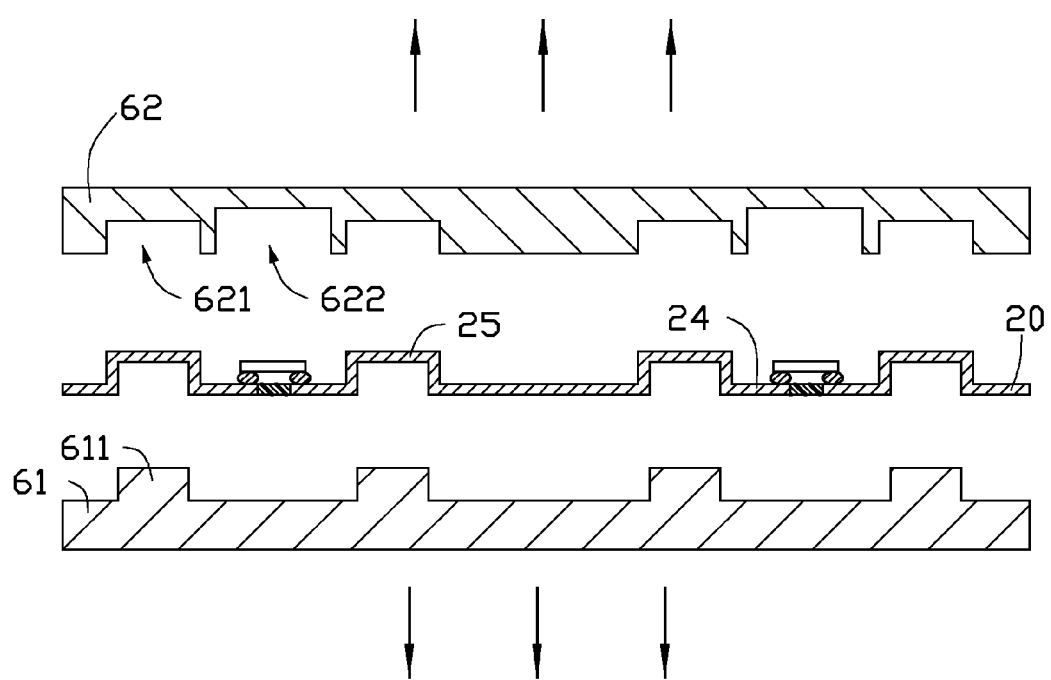

Referring to FIGS. 3 to 5, the second step is to provide a mold 60 to press the metal board 50. By using the mold 60, the metal board 50 is formed to have a plurality of convex portions 25 and a plurality of concave portion 24. Each convex portion 25 surrounds two sides of a corresponding concave portion 24. Each two adjacent convex portions 25 are spaced from each other by a corresponding concave intervening portion (not labeled) therebetween. Each concave portion 24 has one corresponding LED chip 30 received therein. The mold 60 includes a bottom mold body 61 and a top mold body 62. A plurality of protrusions 611 protrude upwardly from an upper surface of the bottom mold body 61. A bottom surface of the top mold body 62 defines a plurality of recesses 621, corresponding to the protrusions 611. A height of each protrusion 611 is substantially equal to that of the corresponding recess 621. The bottom surface of the top mold body 62 also defines a plurality of cavities 622, each corresponding to a respective LED chip 30. A height of each cavity 622 is larger than that of the corresponding LED chip 30. Therefore, when the metal board 50 is pressed by the mold 60, the LED chips 30 do not contact inner faces of the cavities 622.

In molding, the metal board 50 is located between the bottom mold body 61 and the top mold body 62, with the recesses 621 of the top mold body 62 located directly above the protrusions 611 of the bottom mold body 61, respectively. The bottom mold body 61 and the top mold body 62 are pressed towards each other to punch the metal board 50, thereby forming a plurality of convex portions 25 and a plurality of concave portions 24. The convex portions 25 are formed at the protrusions 611 of the bottom mold body 61. Then, the bottom mold body 61 and the top mold body 62 are separated from the metal board 50. The punched metal board 50 thus has a plurality of substantially continuous electrode boards 20.

Figure 6:
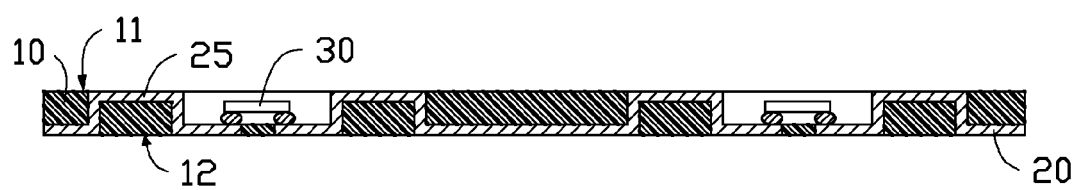

Referring to FIG. 6, the third step is to form a plurality of substantially continuous substrates 10 integrally bound with the continuous electrode boards 20. In the present embodiment, macromolecular material is filled in bottom depressions of the convex portions 25 and top depressions of the concave intervening portions to form the continuous substrates 10. A top surface 11 of each substrate 10 is substantially coplanar with a top surface of the corresponding convex portion 25, and a bottom surface 12 of each substrate 10 is substantially coplanar with a bottommost surface of the corresponding concave portion 24. Therefore, the top surfaces of the convex portions 25 and the bottommost surfaces of the concave portions 24 are exposed to an outside of the continuous substrates 10. Accordingly, each electrode board 20 can be electrically connected to external elements via the top surface of the convex portion 25 and the bottommost surface of the concave portion 24. Thus, the thickness and size of the corresponding LED devices 100 is reduced. In an alternative embodiment, the top surfaces of the convex portions 25 and the bottommost surfaces of the concave portions 24 can be covered by the macromolecular material. In such case, each electrode board 20 can be electrically connected to external elements via side portions of the electrode board 20 which extend outwardly.

Figure 7:
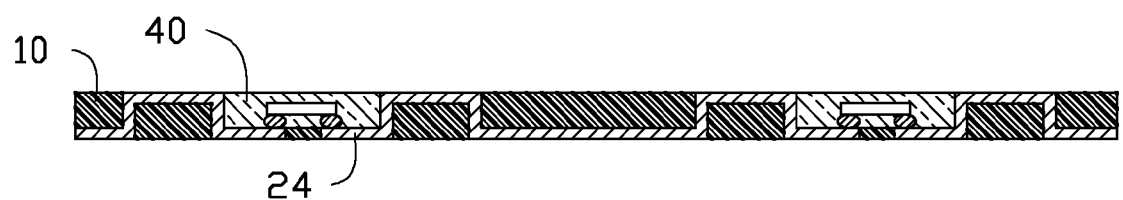

Referring to FIG. 7, the fourth step is to form encapsulants 40 in the concave portions 24 to cover the LED chips 30. In the present embodiment, an upper surface of each encapsulant 40 is substantially coplanar with the top surface 11 of the corresponding substrate 10. Therefore, each LED device 100 is planar and has a smaller height.

Figure 8:
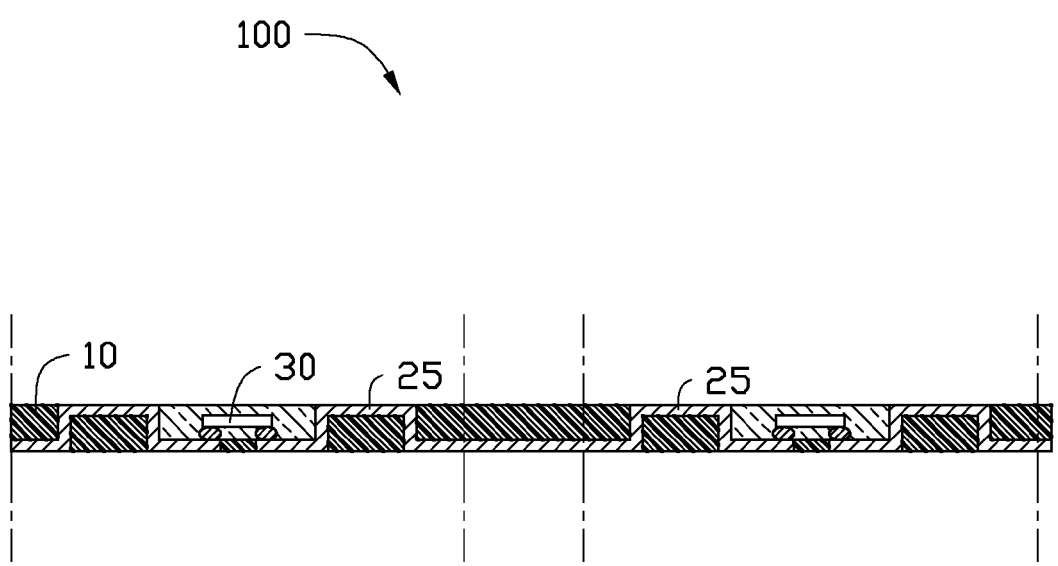

Referring to FIG. 8, the fifth step is to cut the continuous substrates 10 into a plurality of individual LED devices 100. In the present embodiment, each concave intervening portion between two adjacent convex portions 25 of two adjacent LED devices 100 is cut. Therefore, each individual LED device 100 includes a convex portion 25 substantially surrounding the LED chip 30. Thus the LED device 100 does not need a reflective cup on the substrate 10, and so the thickness and size of the LED device 100 is reduced.

It is to be further understood that even though numerous characteristics and advantages have been set forth in the foregoing description of embodiments, together with details of the structures and functions of the embodiments, the disclosure is illustrative only; and that changes may be made in detail, especially in matters of shape, size, and arrangement of parts within the principles of the disclosure to the full extent indicated by the broad general meaning of the terms in which the appended claims are expressed.

What is claimed is:

1. A method for manufacturing a plurality of light emitting diode (LED) devices, the method comprising:
   providing a metal board, a plurality of insulated portions being formed in the metal board to divide the metal board into a plurality of isolated electrode preforms, every two adjacent electrode preforms being electrically connected to a corresponding LED chip therebetween;
   pressing the metal board to form a plurality of concave portions and a plurality of convex portions in the metal board, each convex portion surrounding two sides of a corresponding concave portion, each concave portion having a corresponding LED chip received therein;
   forming a substrate integrally with the metal board including in the convex portions;
   forming an encapsulant in each of the concave portions, the encapsulant covering the LED chips; and
   cutting the substrate into a plurality of individual LED devices;
   wherein pressing the metal board to form a plurality of concave portions and a plurality of convex portions in the metal board comprises:
   providing a mold comprising a top mold body and a bottom mold body, the top mold body forming a plurality of protrusions, the bottom mold body forming a plurality of recesses corresponding to the protrusions; and
   wherein the bottom surface of the top mold body further defines a plurality of cavities each corresponding to a respective one of the LED chips, and a height of each of the plurality of cavities is larger than that of the corresponding LED chip.

2. The method of claim 1, wherein pressing the metal board to form a plurality of concave portions and a plurality of convex portions of the metal board further comprises:
   pressing the metal board by moving the top mold body and the bottom mold body toward each other, the metal board forming the convex portions at the protrusions of the bottom mold body; and
   removing the top mold body and the bottom mold body from the metal board.

3. The method of claim 1, wherein bottommost surfaces of the concave portions are substantially coplanar with a bottom surface of the substrate.

4. The method of claim 1, wherein top surfaces of the convex portions are substantially coplanar with a top surface of the substrate.

5. The method of claim 1, wherein an upper surface of each encapsulant is substantially coplanar with a top surface of the substrate.

6. The method of claim 1, wherein forming a substrate among the metal board including in the convex portions comprises filling macromolecular material in bottom depressions of the convex portions.

7. The method of claim 1, wherein cutting the substrate into a plurality of individual LED devices comprises cutting the substrate between two adjacent convex portions of two neighboring LED devices.

* * * * *